(12) United States Patent  
Kim et al.

(10) Patent No.: US 7,483,328 B2  
(45) Date of Patent: Jan. 27, 2009

(54) VOLTAGE GLITCH DETECTION CIRCUITS AND METHODS THEREOF

(75) Inventors: Eui-Seung Kim, Suwon-si (KR); Jung-Hyun Kim, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 189 days.

(21) Appl. No.: 11/434,933

(22) Filed: May 17, 2006

(65) Prior Publication Data

US 2007/0058452 A1   Mar. 15, 2007

(30) Foreign Application Priority Data

Sep. 8, 2005 (KR) .................. 10-2005-0083498

(51) Int. Cl.  
  *G11C 5/01* (2006.01)

(52) U.S. Cl. ............. 365/226; 365/189.07; 365/189.09; 365/207; 365/210.12

(58) Field of Classification Search ................. 365/226, 365/189.07, 189.09, 207, 210.12  
See application file for complete search history.

(56) References Cited

U.S. PATENT DOCUMENTS

| 6,707,725 B2* | 3/2004 | Morikawa | 365/189.15 |
| 2003/0204696 A1 | 10/2003 | Yi | |
| 2004/0213068 A1* | 10/2004 | Matsue | 365/226 |
| 2005/0146959 A1 | 7/2005 | Shiga | |

FOREIGN PATENT DOCUMENTS

| DE | 10324875 | 1/2004 |
| EP | 1154375 | 11/2001 |
| JP | 2003-263618 | 9/2003 |
| KR | 10-2003-0092777 | 12/2003 |

OTHER PUBLICATIONS

German Office Action dated Feb. 27, 2007.

* cited by examiner

*Primary Examiner*—Pho M. Luu  
(74) *Attorney, Agent, or Firm*—Harness, Dickey & Pierce, PLC

(57) ABSTRACT

Voltage glitch detection circuits and methods thereof. The voltage glitch detection circuit may include a monitoring memory array including at least one memory cell storing reference data, a monitoring sense amplifier receiving stored reference data from the monitoring memory array, amplifying the received stored reference data in response to an operation control signal and outputting data based on the reference data, a data storage circuit including at least one latch to store the reference data and a comparator circuit receiving and comparing the data output from the monitoring sense amplifier and the stored reference data from the data storage circuit, and outputting a detection signal based on the comparison. The voltage glitch detection circuit may include a first storage unit configured to latch a first voltage, a second storage unit configured to latch a second voltage, a first comparator circuit first comparing the latched first voltage with a first reference voltage and outputting a first comparison result, a second compariator circuit second comparing the second voltage with a second reference voltage and outputting a second comparison result and a third comparator circuit third comparing the first and second comparison results and outputting a reset detection signal based on the third comparison.

23 Claims, 7 Drawing Sheets

VOLTAGE GLITCH DETECTION CIRCUITS AND METHODS THEREOF

PRIORITY STATEMENT

This application claims the benefit of Korean Patent Application No. 10-2005-0083498, filed on Sep. 8, 2005, in the Korean Intellectual Property Office, the disclosure of which is incorporated herein in its entirety by reference.

BACKGROUND OF THE INVENTION

1. Field of the Invention

Example embodiments of the present invention relate generally to voltage glitch detection circuits and methods thereof, and more particularly to voltage glitch detection circuits included within integrates circuits and methods thereof.

2. Description of Related Art

An integrated circuit (IC) card, which may be alternatively referred to as a "smart card", may be embodied as a credit-card sized plastic card with an embedded semiconductor chip. The IC card may achieve higher data integrity than conventional magnetic stripe cards. Also, the IC card may be capable of higher security protocols to protect data (e.g., additional encryption, etc.).

Data stored within an IC card may be retained, but the stored data may be vulnerable to an attacker during data transfer. For example, if an attacker directly monitors signals in the IC card to ascertain data stored therein, the monitored data may be "leaked" to the attacker.

Therefore, the IC card may include detectors to detect abnormal conditions (e.g., abnormal voltage, frequency, temperature, glitches, light exposure, etc.). If one or more of the detectors detects an abnormal condition and outputs a detection signal indicating the detected abnormal condition, all circuits including a central processing unit (CPU) installed within the IC card may be reset. Accordingly, the IC card may protect data from loss, destruction and/or variation caused by external attack under certain circumstances.

FIG. 1 illustrates a conventional IC card 10. Referring to FIG. 1, the IC card 10 may include a memory array 12, a row decoder 14, a column decoder 16, a sense amplifier 18, an output buffer 20 and a capacitor 22.

Referring to FIG. 1, the memory array 12 may include a plurality of non-volatile memory cells, for example, Electrically Erasable Programmable Read Only Memory (EEPROM) cells and/or flash memory cells. The row decoder 14 and the column decoder 16, respectively, may assign a region of the memory array 12, where data may either be written to or read from, based on a row address XADD and a column address YADD output from a control circuit (not shown).

Referring to FIG. 1, the sense amplifier 18 may amplify a voltage output from the memory array 12 and may output data set to a first logic level (e.g., a higher logic level or logic "1") or a second logic level (e.g., a lower logic level or logic "0") based on a logic level (e.g., "0", "1", etc.) of the data stored in the region assigned by the row decoder 14 and the column decoder 16. The output buffer 20 may latch the data output from the sense amplifier 18 and may output stable data.

Referring to FIG. 1, the capacitor 22 may be connected to an internal power source VDD and a ground voltage VSS of the sense amplifier 18 to protect against potential instability of the internal power source VDD and/or a "power attack" (e.g., an attempt made by an attacker to extract data from the memory cell array 12 without authorization).

However, if a power attack exceeding a limit (e.g., a current or voltage limit) of the capacitor 22 is attempted by an attacker, (e.g., an attacker causes an intentional glitch or power spike in the internal power source VDD), the sense amplifier 18 may fail to properly read the data stored in the memory array 12. Thus, a read failure may occur in the sense amplifier 18.

SUMMARY OF THE INVENTION

An example embodiment of the present invention is directed to a voltage glitch detection circuit, including a monitoring memory array including at least one memory cell storing reference data, a monitoring sense amplifier receiving stored reference data from the monitoring memory array, amplifying the received stored reference data in response to an operation control signal and outputting data based on the reference data, a data storage circuit including at least one latch to store the reference data and a comparator circuit receiving and comparing the data output from the monitoring sense amplifier and the stored reference data from the data storage circuit, and outputting a detection signal based on the comparison.

Another example embodiment of the present invention is directed to a voltage glitch detection circuit, including a first storage unit configured to latch a first voltage, a second storage unit configured to latch a second voltage, a first comparator circuit first comparing the latched first voltage with a first reference voltage and outputting a first comparison result, a second compariator circuit second comparing the second voltage with a second reference voltage and outputting a second comparison result and a third comparator circuit third comparing the first and second comparison results and outputting a reset detection signal based on the third comparison.

Another example embodiment of the present invention is directed to a method of controlling operation of an integrated circuit, including receiving first reference data from a first source, receiving second reference data from a second source, comparing the first reference data and the second reference data outputting a detection signal based on the comparison, the detection signal indicating whether to reset the integrated circuit.

Another example embodiment of the present invention is directed to a method of controlling operation of an integrated circuit, including latching a first voltage and a second voltage, comparing the latched first voltage with a first reference voltage and outputting a first comparison result, comparing the latched second voltage with a second reference voltage and outputting a second comparison result and comparing the first and second comparison results and outputting a reset detection signal as a third comparison result.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE PRESENT INVENTION

Figure 1:
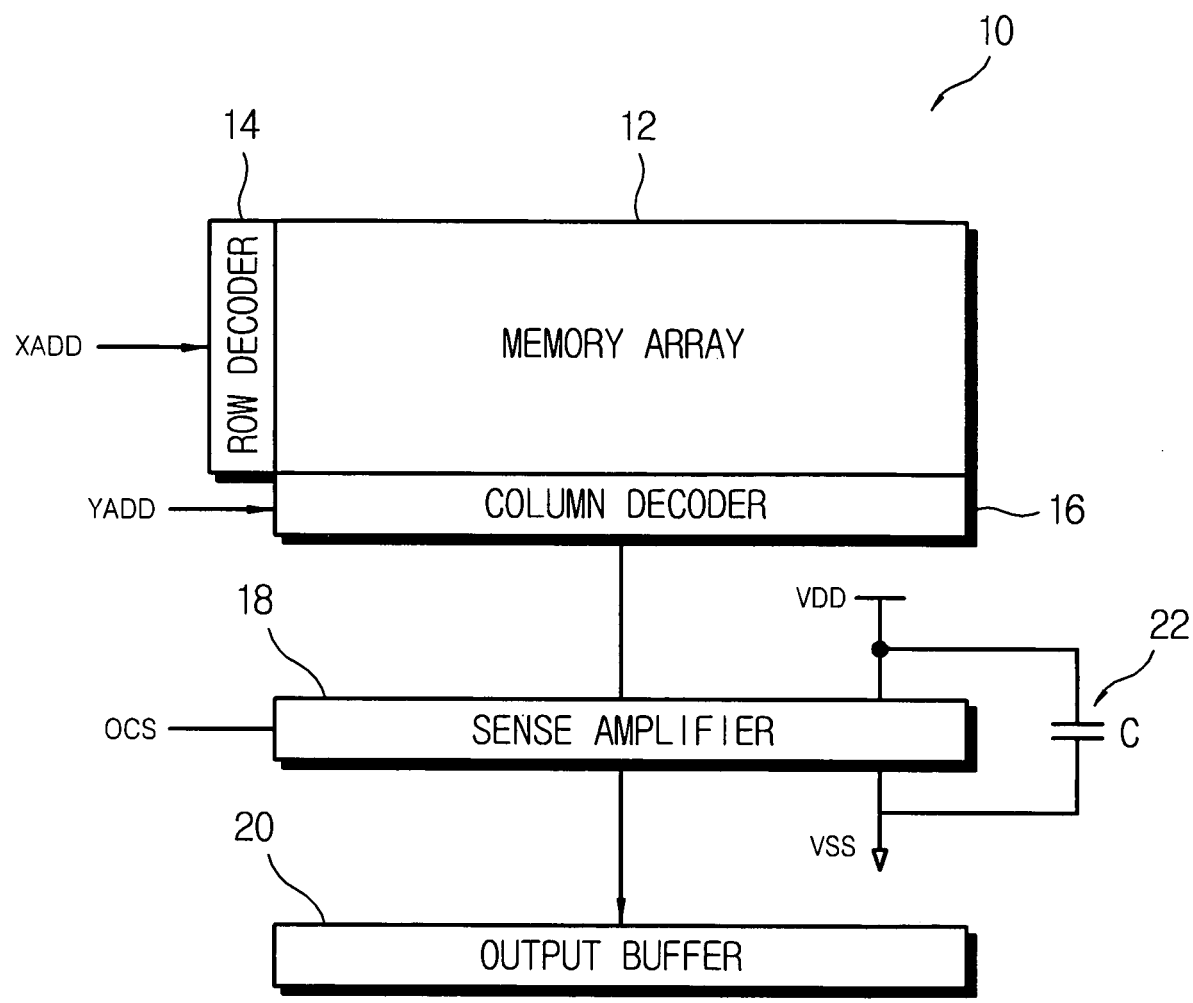
FIG. 1 illustrates a conventional integrated circuit card.

Example embodiments of the present invention are described more fully hereinafter with reference to the accompanying drawings, in which example embodiments of the present invention are shown. This invention may, however, be embodied in many different forms and should not be construed as limited to the example embodiments set forth herein. Rather, these example embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 2:
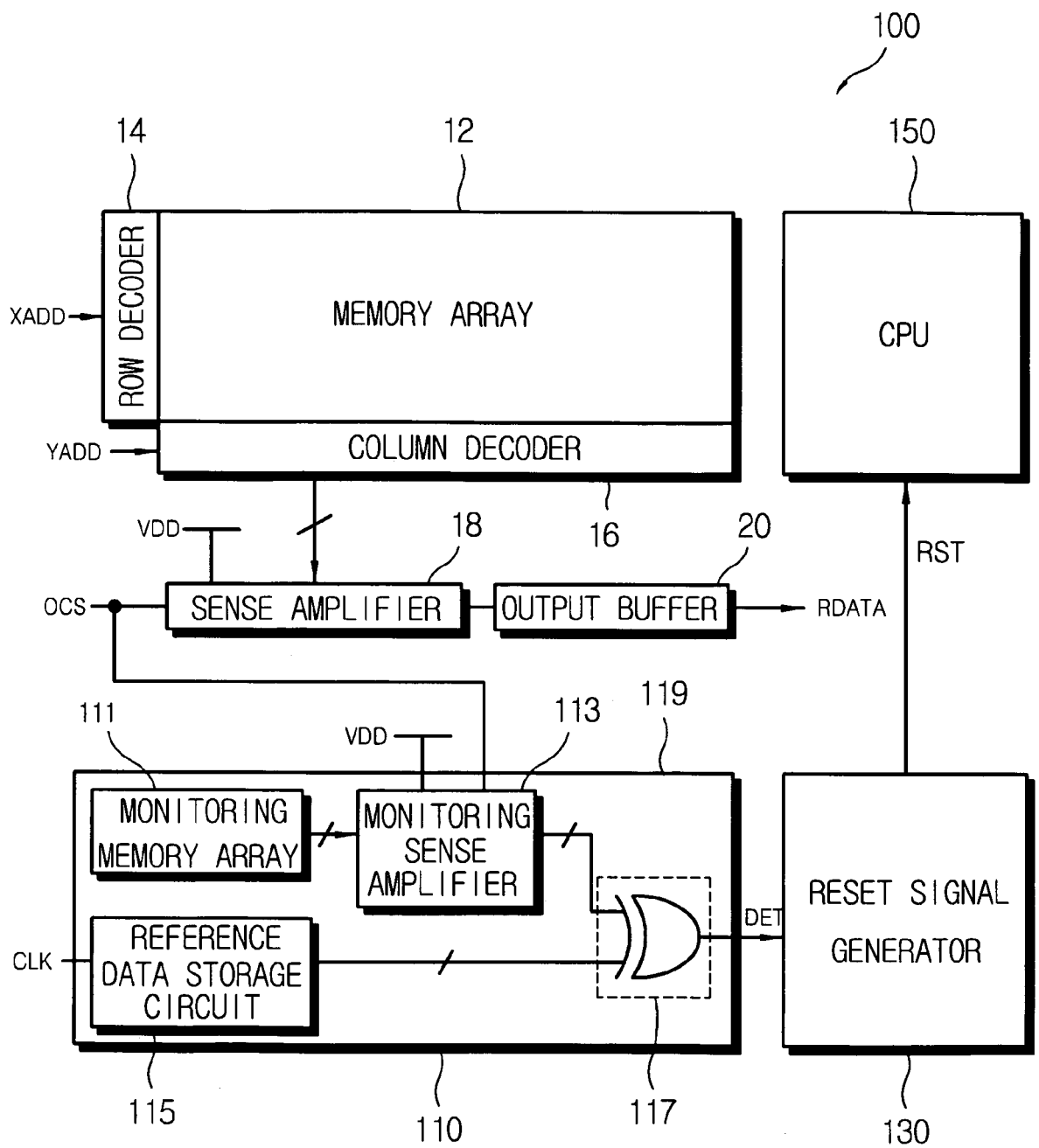
FIG. 2 illustrates an integrated circuit according to an example embodiment of the present invention.

FIG. 2 illustrates an integrated circuit (IC) 100 according to an example embodiment of the present invention.

In the example embodiment of FIG. 2, the integrated circuit 100 may include a memory array 12, a row decoder 14, a column decoder 16, a sense amplifier 18, an output buffer 20, a voltage glitch detection circuit 110, a reset signal generator 130 and a CPU 150. In an example, the integrated circuit 100 may be mounted on a smart card or an IC card.

In the example embodiment of FIG. 2, the voltage glitch detection circuit 110 may compare digital data read by a monitoring sense amplifier 113 with digital data stored in a reference data storage circuit 115. The voltage glitch detection circuit may detect a glitch (e.g., a voltage difference, such as a relative spike or voltage drop) in an internal voltage VDD supplied to the sense amplifier 18 and the monitoring sense amplifier 113 based on the comparison. The voltage glitch detection circuit 110 may include a monitoring memory array 111, the monitoring sense amplifier 113, the reference data storage circuit 115 and a comparator circuit 117.

In the example embodiment of FIG. 2, the monitoring memory array 111 may include at least one memory cell. In an example, the at least one memory cell may include the same electrical properties as memory cells included among the memory array 12. Also, the at least one memory cell may include one or more non-volatile memory cell, such as EEPROM cells and/or flash memory cells.

In the example embodiment of FIG. 2, in another example, the monitoring memory array 111 may be a data storage circuit. The data storage circuit may include an element modeling electric current flowing through the respective memory cells of the memory array 12, for example, a resistance. In another example, the monitoring sense amplifier 113 may be an amplifier configured to monitor a read operation of the sense amplifier 18 and may have characteristics substantially identical with those of the sense amplifier 18. Also, the monitoring sense amplifier 113 may sense and amplify data stored in the monitoring memory array 111 at given times, for example, when the sense amplifier 18 reads data from the memory array 12 (e.g., during a read operation). The internal voltage VDD may be supplied to the sense amplifier 18 and the monitoring sense amplifier 113.

In the example embodiment of FIG. 2, the reference data storage circuit 115 may be a register including at least one latch, for example, a D flip-flop. The reference data storage circuit 115 may store reference digital data in response to a clock signal CLK.

In the example embodiment of FIG. 2, the comparator circuit 117 may receive data set to one of the first logic level and the second logic level from the monitoring sense amplifier 113 as well as data output from the reference data storage circuit 115. The comparator circuit 117 may compare the received data and may output a detection signal DET based on a result of the comparison. In an example, the comparator circuit 117 may be implemented as an exclusive OR gate 119 including a first input terminal connected to an output terminal of the monitoring sense amplifier 113, a second input terminal connected to an output terminal of the reference data storage circuit 115 and an output terminal for outputting a detection signal DET. However, it is understood any well-known type of comparator circuit may be employed as the comparator circuit 117.

In the example embodiment of FIG. 2, The reset signal generator 130 may generate a reset signal RST in response to the detection signal DET output from the comparator circuit 117. The CPU 150 controlling operation of the integrated circuit 100 may be reset in response to the reset signal RST.

Figure 3:
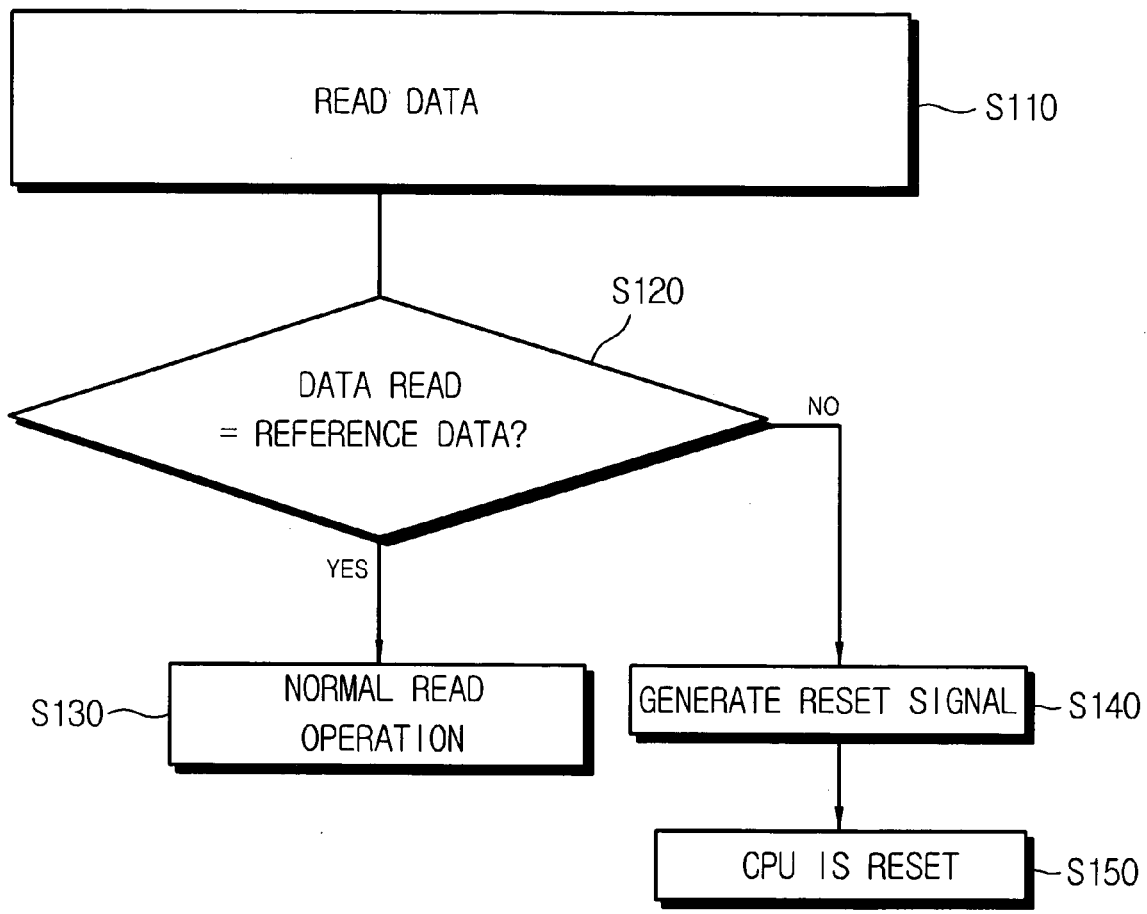
FIG. 3 is a flow chart illustrating an operation of the integrated circuit of FIG. 2 according to another example embodiment of the present invention.

FIG. 3 is a flow chart illustrating an operation of the integrated circuit 100 of FIG. 2 according to another example embodiment of the present invention. Example operation of FIG. 3 will now be described with reference to FIG. 2.

In the example embodiment of FIG. 2 and FIG. 3, if a given power is applied to the integrated circuit 100, the reference data storage circuit 115, including a plurality of latches, may be initialized (e.g., each of the plurality of latches may be set to a logic level of a received data input) in response to a clock signal CLK (e.g., a rising edge or active portion of CLK). Thus, the reference data storage circuit 115 may store reference data (e.g. 01001100) in response to the clock signal CLK. It may be assumed that the same data (e.g., 01001100) as that stored in the reference data storage circuit 115 may likewise be stored in the monitoring memory array 111.

In the example embodiment of FIG. 2 and FIG. 3, during a read operation, the sense amplifier 18 may sense and amplify data stored in a region of the memory array 12 which may be designated or assigned by the row decoder 14 and the column decoder 16, based on a row address XADD and a column address YADD, in response to an operation control signal OCS. The sense amplifier 18 may output data set to either the first or second logic level based on a logic level of data stored in the assigned region.

In the example embodiment of FIG. 2 and FIG. 3, during a read operation, the monitoring sense amplifier 113 may sense and amplify data (e.g., 01001100) stored in the monitoring memory array 111 in response to the operation control signal (OCS) and may output data set to either the first or second logic levels (at S110). The comparator circuit 117 may receive the data (e.g., 01001100) output from the monitoring sense amplifier 113 and the data (e.g., 01001100) stored in the reference data storage circuit 115, may compare the received data (at S120) and may output a detection signal DET based on a result of the comparison.

In the example embodiment of FIG. 2 and FIG. 3, if a glitch occurs in the internal voltage VDD supplied to the monitoring sense amplifier 113 and/or the internal voltage VDD is not stable (e.g., due to noise), the monitoring sense amplifier 113 may fail to correctly amplify the data (e.g., 01001100) stored in the monitoring memory array 111. Therefore, in an example, if the data that the monitoring sense amplifier 113 reads from the monitoring memory array 111 is 11001100, the comparator circuit 117 may output the detection signal DET at the first logic level (e.g., a higher logic level or logic "1") (at S140). Thus, a read failure may occur in the monitoring sense amplifier 113, and as such the integrated circuit 100 may be reset, as will now be described.

In the example embodiment of FIG. 2 and FIG. 3, the reset signal generator 130 may generate a reset signal RST at the first logic level (e.g., a higher logic level or logic "1") in response to the detection signal DET set to the first logic level. The CPU 150 may be reset in response to the reset signal RST set to the first logic level such that the CPU 150 may no longer access the memory array 12 (at S150). Accordingly, the data stored in the memory array 12 may be protected against an attacker if a glitch is detected.

In the example embodiment of FIG. 2 and FIG. 3, if no glitch occurs in the internal voltage VDD supplied to the monitoring sense amplifier 113 and/or the internal voltage VDD is stable (e.g., irrespective of noise), the monitoring sense amplifier 113 may read data (e.g., 01001100) from the monitoring memory array 111 and thereby, the comparator circuit 117 may output the detection signal DET at the second logic level (e.g., a lower logic level or logic "0").

In the example embodiment of FIG. 2 and FIG. 3, the reset signal generator 130 may generate a reset signal RST set to the second logic level (e.g., a lower logic level or logic "0") in response to the detection signal DET set to the second logic level. Therefore, the CPU 150 may access the memory array 12 because the reset signal RST remains inactive and/or set to the second logic level (at S130). Thus, the sense amplifier 18 may perform normal read operations as instructed by the CPU 150.

In the example embodiment of FIG. 2 and FIG. 3, if an attacker causes the external voltage supplied to the integrated circuit 100 to fluctuate or become abnormal, the internal voltage VDD (e.g., which may be associated with the external voltage) may likewise become abnormal. Therefore, if a read failure occurs in the monitoring sense amplifier 113 due to instability of the internal voltage VDD supplied to the monitoring sense amplifier 113, the internal voltage VDD supplied to the sense amplifier 18 (e.g., that may have the same characteristics as the monitoring sense amplifier 113) may also be unstable.

Figure 4:
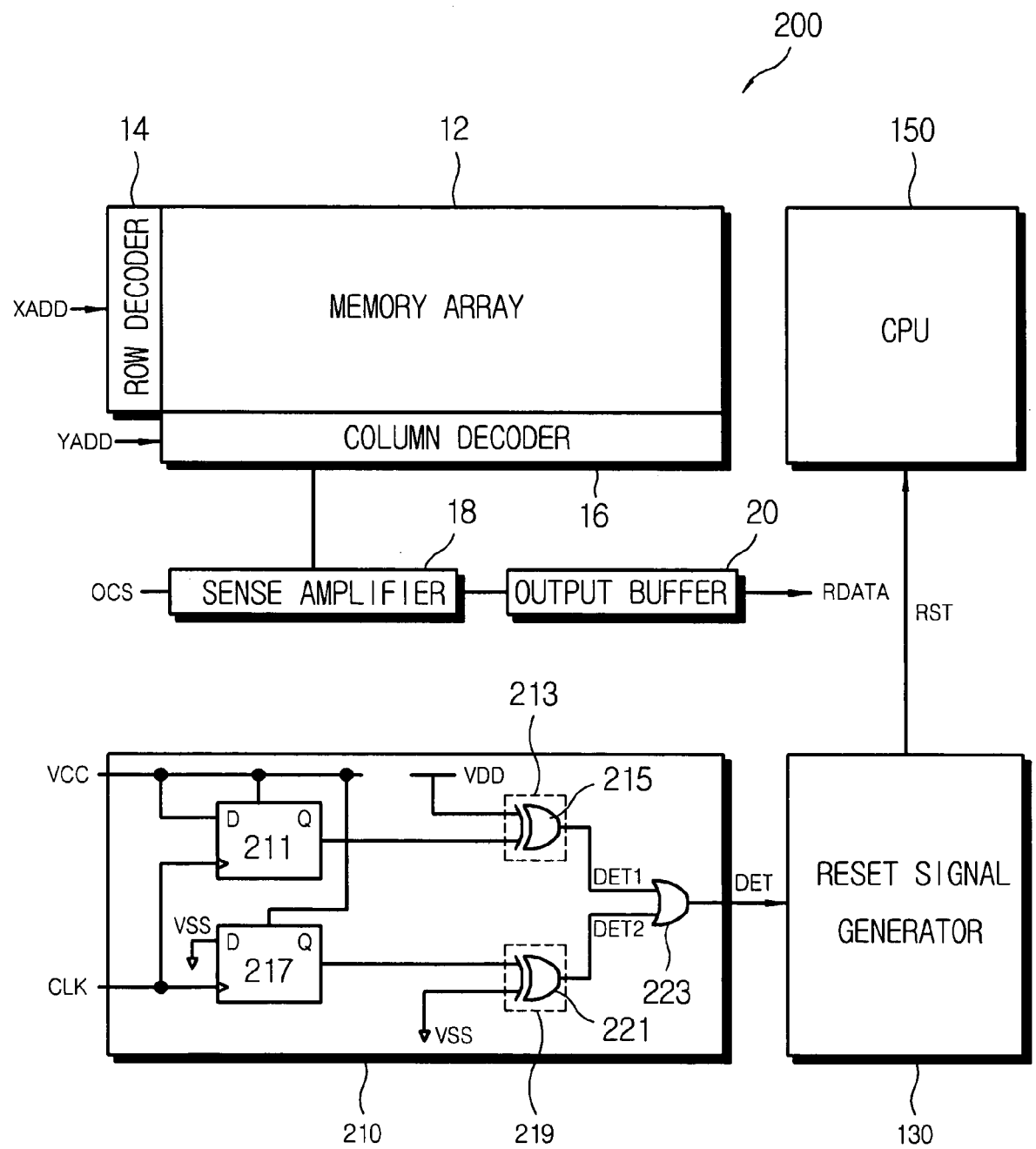
FIG. 4 illustrates an integrated circuit according to another example embodiment of the present invention.

FIG. 4 illustrates an integrated circuit 200 according to another example embodiment of the present invention. The integrated circuit 100 of FIG. 2 and the integrated circuit 200 of FIG. 4 may be identical except for the voltage glitch detection circuit 210 of FIG. 4 being deployed in place of the voltage glitch circuit 110 of FIG. 2.

In the example embodiment of FIG. 4, the voltage glitch detection circuit 210 may compare data output from latches 211 and 217, which may be powered by the external voltage VCC and may receive, as inputs, the external voltage VCC and the ground voltage VSS, respectively. The voltage glitch detection circuit 210 may generate a detection signal DET based on a result of the comparison. Thus, a logic level of the detection signal DET may be used to evaluate the stability of the external voltage VCC. The voltage glitch detection circuit 210 may include a first latch 211, a first comparator circuit 213, a second latch 217, a second comparator circuit 219 and an OR gate 223.

In the example embodiment of FIG. 4, the first latch 211 may latch a signal (e.g., a data signal) having a voltage level equal to the external voltage VCC in response to a clock signal CLK, if the external voltage VCC has a "normal" level. However, if the external voltage VCC has an "abnormal" level (e.g., a ground voltage VSS) (e.g., due to a glitch, noise, etc.), the first latch 211 may latch data set to the second logic level (e.g., a lower logic level or logic "0").

In the example embodiment of FIG. 4, the first comparator circuit 213 may receive an output signal of the first latch 211 and the internal voltage VDD, may compare the received output signal with the internal voltage VDD and may output a detection signal DET1 based on a result of the comparison. In an example, the first comparator circuit 213 may be embodied as an exclusive OR gate 215 including a first input terminal for receiving the internal voltage VDD, a second input terminal for latching an output signal of the first latch 211 and an output terminal for outputting the detection signal DET1. In an example, the first comparator circuit 213 may output the detection signal DET1 set to the second logic level (e.g., a lower logic level or logic "0") if the external voltage VCC has a "normal" level, and the first comparator circuit 213 may output the detection signal DET1 set to the first logic level (e.g., a higher logic level or logic "1") if the external voltage VCC has an abnormal level.

In the example embodiment of FIG. 4, the second latch 217 may latch a signal (e.g., a data signal) set to a ground voltage VSS in response to a clock signal CLK, if the external voltage VCC has a normal level. However, if the external voltage VCC has an abnormal level (e.g., a ground voltage VSS) (e.g., due to a glitch, noise, etc.), the second latch 217 may latch data set to the first logic level (e.g., a higher logic level or logic "1").

In the example embodiment of FIG. 4, the second comparator circuit 219 may receive an output signal of the second latch 217 and a ground voltage VSS. The second comparator circuit 219 may compare the received output signal with the ground voltage VSS and may output a detection signal DET2 based on a result of the comparison. In an example, the second comparator circuit 219 may be embodied as an exclusive OR gate 221. For example, the second comparator circuit 219 may output the detection signal DET2 set to the second logic level (e.g., a lower logic level or logic "0") if the external voltage VCC has a "normal" or expected level, and the second comparator circuit 219 may alternatively output a detection signal DET2 set to the first logic level (e.g., a higher logic level or logic "1") if the external voltage VCC has an abnormal level.

In the example embodiment of FIG. 4, the OR gate 223 may receive the output signals DET1 and DET2 from the first comparator circuit 213 and the second comparator circuit 219, respectively, and may perform an OR operation on the received signals. The OR gate 223 may output a detection signal DET based on a result of the comparison (e.g., an OR operation). The OR gate 223 may output the detection signal DET set to the second logic level (e.g., a lower logic level or logic "0") if the external voltage VCC has a normal level, and the OR gate 223 may alternatively output the detection signal DET set to the first logic level (e.g., a higher logic level or logic "1") if the external voltage VCC has an abnormal level.

Figure 5:
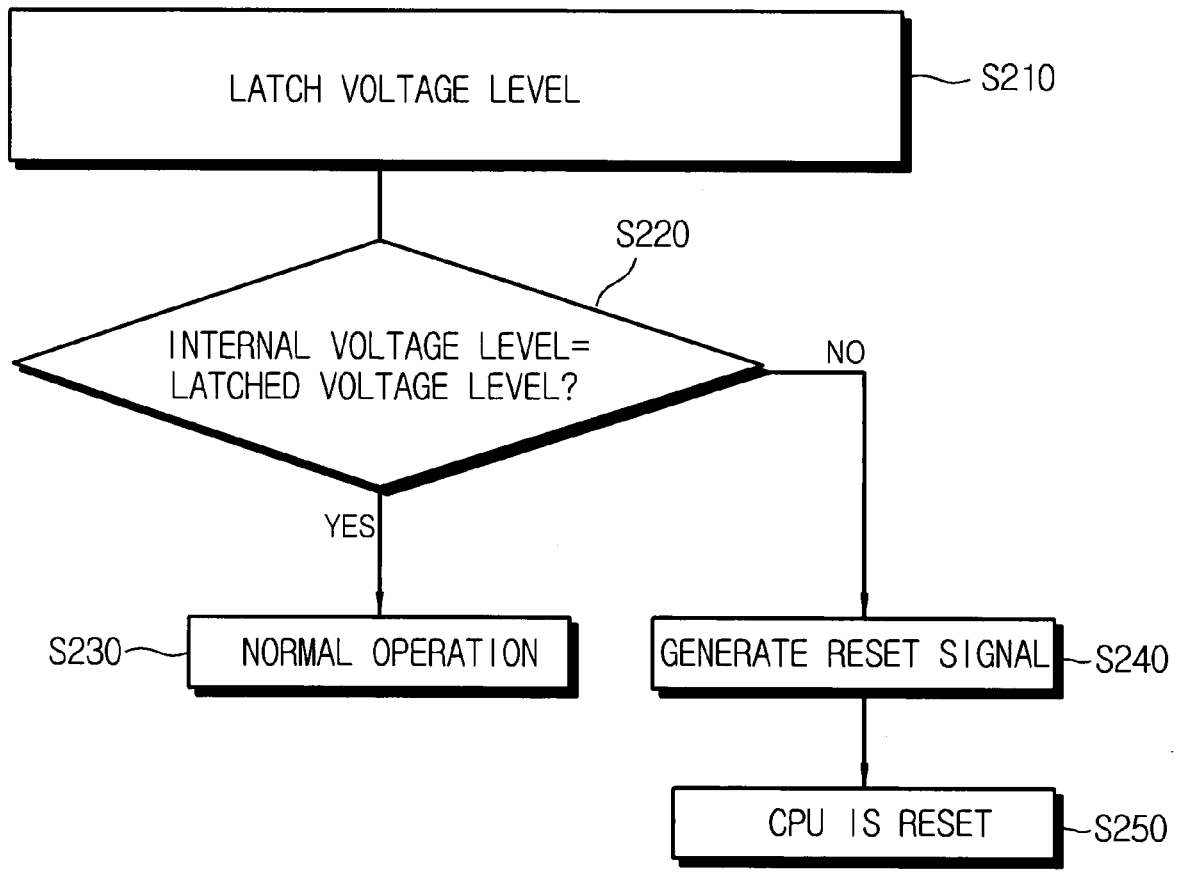
FIG. 5 is a flow chart illustrating the operation of the integrated circuit of FIG. 4 according to another example embodiment of the present invention.

FIG. 5 is a flow chart illustrating the operation of the integrated circuit 200 of FIG. 4 according to another example embodiment of the present invention. Example operation of FIG. 5 will now be described with reference to FIG. 4.

In the example embodiment of FIG. 4 and FIG. 5, the corresponding latches 211 and 217 may latch data having a voltage level of the external voltage VCC or data having a voltage level of the ground voltage VSS in response to a clock signal CLK (at S210). The corresponding latches 211 and 217 may latch data having the voltage level of a corresponding input signal VCC or VSS if the external voltage VCC has a normal level. Alternatively, the corresponding latches 211 and 217 may latch data having a given voltage level (e.g., VSS or VCC) difference from a voltage level of the input signal VCC or VSS if the external voltage VCC has an abnormal level (e.g., due to a glitch, noise, etc.).

In the example embodiment of FIG. 4 and FIG. 5, the corresponding comparator circuits 213 and 219, respectively, may compare the voltage level of the internal voltage (e.g., VDD or VSS) with the voltage level of the data latched by the corresponding latches 211 and 217, respectively, and may output corresponding detection signals DET1 and DET2 based on a result of the comparison (at S220).

In the example embodiment of FIG. 4 and FIG. 5, if the external voltage VCC has the normal level, the corresponding comparator circuits 213 and 219 may output the corresponding detection signals DET1 and DET2 set to the second logic level (e.g., a lower logic level or logic "0") and the voltage glitch detection circuit 210 may output the detection signal DET set to the second logic level.

In the example embodiment of FIG. 4 and FIG. 5, the reset signal generator 130 may generate a reset signal RST set to the second logic level in response to the detection signal DET set to the second logic level. Therefore, the CPU 150 may access the memory array 12 in response to the reset signal RST being maintained at the second logic level (e.g., an inactive reset state) (at S230).

In the example embodiment of FIG. 4 and FIG. 5, if the external voltage VCC has an abnormal level (e.g., due to a glitch, noise, etc.), at least one of the comparator circuits 213 and 219 may output the detection signal DET1 and/or DET2 set to the first logic level (e.g., a higher logic level or logic "1") and the voltage glitch detection circuit 210 may output the detection signal DET set to the first logic level (e.g., a higher logic level or logic "1"). The reset signal generator 130 may generate a reset signal RST set to the first logic level in response to the detection signal DET being set to the first logic level (at S240). Therefore, the CPU 150 may be reset in response to the reset signal RST being set to the first logic level, and the CPU 150 may thereby be denied access to the memory array 12 (at S250).

Figure 6:
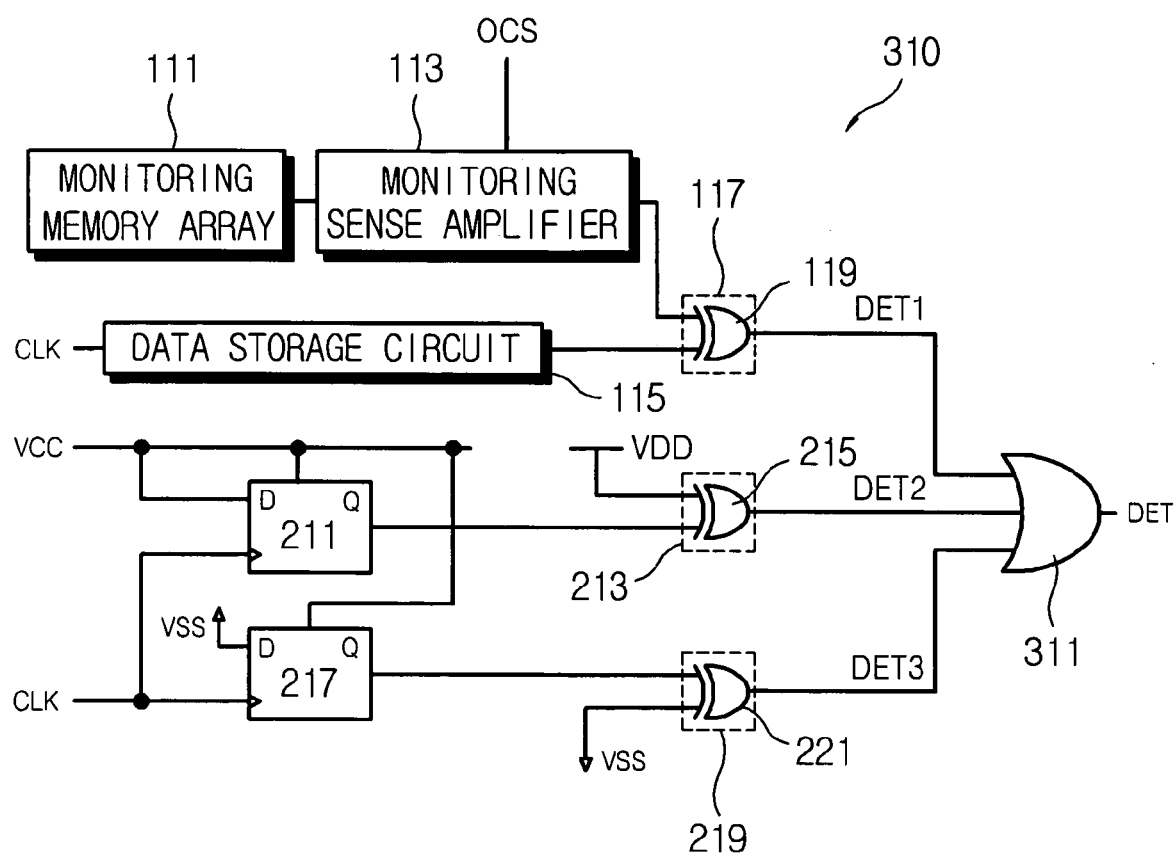
FIG. 6 illustrates a voltage glitch detection circuit according to another example embodiment of the present invention.

FIG. 6 illustrates a voltage glitch detection circuit 310 according to another example embodiment of the present invention.

In the example embodiment of FIG. 6, the voltage glitch detection circuit 310 may include a monitoring memory array 111, a monitoring sense amplifier 113, reference data storage circuit 115, comparator circuit 117, a first latch 211, a first comparator circuit 213, a second latch 217, a second comparator circuit 219 and an OR gate 311.

In the example embodiment of FIG. 6, the voltage glitch detection circuit 310 may output a detection signal DET using the detecting methodologies of both the example embodiment of FIGS. 2-3 and the example embodiment of FIGS. 4-5. Accordingly, the voltage glitch detection circuit 310 may output a detection signal DET1 by monitoring a read operation of the sense amplifier 18 (e.g., based on whether an abnormal internal voltage VDD is supplied to the sense amplifier 18), as described with reference to FIG. 2 and FIG. 3. The voltage glitch detection circuit 310 may also output corresponding detection signals DET2 and DET3 by monitoring a fluctuation of an external voltage VCC supplied to the corresponding latches 211 and 217, respectively, as described with reference to FIG. 4 and FIG. 5, and may detect the fluctuation of the external voltage VCC and/or the fluctuation of the abnormal internal voltage VDD. The OR gate 311 may receive each of the detection signals DET1, DET2 and DET3, may perform an OR operation on the received signals and may output the OR operation result as the detection signal DET.

Figure 7:
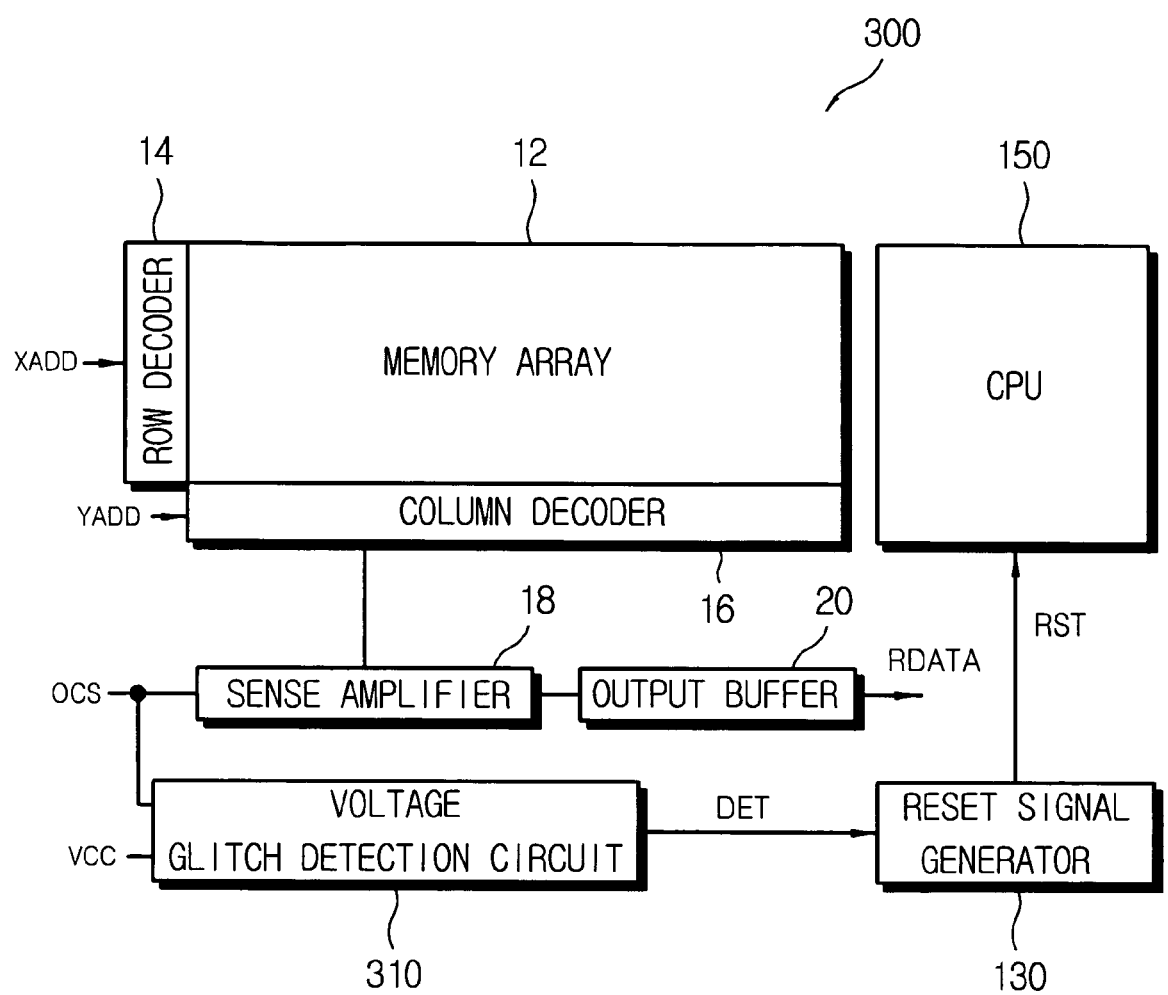
FIG. 7 illustrates an integrated circuit including the voltage glitch detection circuit of FIG. 6 according to another example embodiment of the present invention.

FIG. 7 illustrates an integrated circuit 300 including the voltage glitch detection circuit 310 of FIG. 6 according to another example embodiment of the present invention.

In the example embodiment of FIG. 7, the integrated circuit 300 may include a memory array 12, a row decoder 14, a column decoder 16, a sense amplifier 18, an output buffer 20, a voltage glitch detection circuit 310, a reset signal generator 130 and a CPU 150.

In the example embodiment of FIG. 7, if the voltage glitch detection circuit 310 outputs a detection signal DET set to the first logic level (e.g., a higher logic level or logic "1"), the reset signal generator 130 may output a reset signal RST set to the first logic level to the CPU 150. The CPU 150 may reset an operation of the integrated circuit 300 in response to the reset signal RST being set to the first logic level.

In another example embodiment of the present invention, a voltage glitch detection circuit may monitor an unstable and/or abnormal internal voltage supplied to a sense amplifier by using a monitoring sense amplifier. The voltage glitch detection circuit may compare a data level of a latch having an operating voltage of an external voltage with an internal voltage and may detect an abnormality of the external voltage based on a result of the comparison.

In another example embodiment of the present invention, an integrated circuit including a CPU and a voltage glitch detection circuit may detect an abnormal internal voltage and/or an abnormal external voltage supplied to the integrated circuit and may reset an operation of the CPU based on a result of the detection, thereby increasing a security of data stored in the integrated circuit.

Example embodiments of the present invention being thus described, it will be obvious that the same may be varied in many ways. For example, while the above-described example embodiments refer to the first logic level as being a higher logic level or logic "1" and the second logic level as being a lower logic level or logic "0", it is understood that other example embodiments may be configured such that the first logic level is lower than the second logic level.

Such variations are not to be regarded as departure from the spirit and scope of example embodiments of the present invention, and all such modifications as would be obvious to one skilled in the art are intended to be included within the scope of the following claims.

What is claimed is:

1. A voltage glitch detection circuit, comprising:
   a monitoring memory array including at least one memory cell storing reference data;
   a monitoring sense amplifier receiving stored reference data from the monitoring memory array, amplifying the received stored reference data in response to an operation control signal and outputting data based on the reference data;
   a data storage circuit including at least one latch to store the reference data; and
   a comparator circuit receiving and comparing the data output from the monitoring sense amplifier and the stored reference data from the data storage circuit, and outputting a detection signal based on the comparison.

2. The voltage glitch detection circuit of claim 1, wherein the comparator circuit is an exclusive OR circuit.

3. The voltage glitch detection circuit of claim 1, wherein the at least one latch of the data storage circuit latches the reference data in response to a clock signal.

4. An integrated circuit, comprising:
   the voltage glitch detection circuit of claim 1;
   a reset signal generator generating a reset signal in response to the detection signal; and
   a central processing unit (CPU) configured to be reset in response to the reset signal.

5. The integrated circuit of claim 4, wherein the at least one memory cell includes at least one non-volatile memory cell storing the reference data.

6. he integrated circuit of claim 4, wherein the comparator circuit is an exclusive OR gate including a first input terminal receiving the data read from the monitoring sense amplifier, a second input terminal receiving the reference data and an output terminal outputting the detection signal.

7. The integrated circuit of claim 4, wherein the detection signal indicates to reset the integrated circuit if the comparison indicates that the data output from the monitoring sense amplifier and the stored reference data from the data storage circuit is not the same and the detection signal does not indicate to reset the integrated circuit if the comparison indicates that the data output from the monitoring sense amplifier and the stored reference data from the data storage circuit is the same.

8. A method of controlling operation of an integrated circuit including the voltage glitch detection circuit of claim 1.

9. A voltage glitch detection circuit, comprising:
   a first storage unit configured to latch a first voltage;
   a second storage unit configured to latch a second voltage;
   a first comparator circuit first comparing the latched first voltage with a first reference voltage and outputting a first comparison result;
   a second compariator circuit second comparing the second voltage with a second reference voltage and outputting a second comparison result; and
   a third comparator circuit third comparing the first and second comparison results and outputting a reset detection signal based on the third comparison.

10. The voltage glitch detection circuit of claim 9, wherein each of the first and second latched voltages are one of an external power voltage and a ground voltage.

11. The voltage glitch detection circuit of claim 9, wherein the first and second reference voltages are an internal power voltage and a ground voltage, respectively.

12. The voltage glitch detection circuit of claim 9, wherein the first and second comparator circuits are exclusive OR circuits and the third comparator circuit is an OR circuit.

13. An integrated circuit, comprising:
   the voltage glitch detection circuit of claim 9;
   a reset signal generator generating a reset signal in response to the reset detection signal; and
   a central processing unit (CPU) configured to be reset in response to the reset signal.

14. A combination voltage glitch detection circuit, comprising:
   a voltage glitch detection circuit including a monitoring memory array including at least one memory cell storing reference data, a monitoring sense amplifier receiving stored reference data from the monitoring memory array, amplifying the received stored reference data in response to an operation control signal and outputting data based on the reference data, a data storage circuit including at least one latch to store the reference data and a comparator circuit receiving and comparing the data output from the monitoring sense amplifier and the stored reference data from the data storage circuit, and outputting a detection signal based on the comparison; and
   the voltage glitch detection circuit of claim 9, wherein the third comparator further compares the first and second comparison results with the detection signal to generate the reset detection signal.

15. An integrated circuit, comprising:
   the combination voltage glitch detection circuit of claim 14;
   a reset signal generator generating a reset signal in response to the reset detection signal; and
   a central processing unit (CPU) configured to be reset in response to the reset signal.

16. A method of controlling operation of an integrated circuit including the voltage glitch detection circuit of claim 9.

17. A method of controlling operation of an integrated circuit, comprising:
   receiving first reference data from a first source;
   receiving second reference data from a second source;
   comparing the first reference data and the second reference data; and
   outputting a detection signal based on the comparison, the detection signal indicating whether to reset the integrated circuit.

18. The method of claim 17, wherein the first source is a monitoring memory array and the second source is a data storage unit.

19. A method of controlling operation of an integrated circuit, comprising:
   latching a first voltage and a second voltage;
   comparing the latched first voltage with a first reference voltage and outputting a first comparison result;
   comparing the latched second voltage with a second reference voltage and outputting a second comparison result; and comparing the first and second comparison results and outputting a reset detection signal as a third comparison result.

20. The method of claim 19, wherein each of the first and second latched voltages are one of an external power voltage and a ground voltage.

21. The method of claim 19, wherein the first and second reference voltages are an Internal power voltage and a ground voltage, respectively.

22. The method of claim 19, wherein the first and second comparison results are based on an exclusive OR operation and the third comparison result is based on an OR operation.

23. The method of claim 19, further comprising:
receiving first reference data from a first source, receiving second reference data from a second source, comparing the first reference data and the second reference data outputting a detection signal based on the comparison, the detection signal indicating whether to reset the integrated circuit, and
wherein the third comparison result is generated by comparing the first and second comparison results with the detection signal to generate the reset detection signal.

* * * * *